(12) United States Patent
Small et al.

(10) Patent No.: US 7,276,180 B2
(45) Date of Patent: *Oct. 2, 2007

(54) CHEMICAL MECHANICAL POLISHING COMPOSITION AND PROCESS

(75) Inventors: Robert J. Small, Dublin, CA (US); Laurence McGhee, Duntocher (GB); David J. Maloney, Livermore, CA (US); Maria L. Peterson, Menlo Park, CA (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/401,405

(22) Filed: Mar. 27, 2003

(65) Prior Publication Data

US 2003/0176068 A1    Sep. 18, 2003

Related U.S. Application Data

(63) Continuation of application No. 09/226,996, filed on Jan. 7, 1999, now Pat. No. 6,635,186, which is a continuation of application No. 09/043,505, filed as application No. PCT/US97/12220 on Jul. 21, 1997, now Pat. No. 6,117,783.

(60) Provisional application No. 60/023,299, filed on Jul. 26, 1996.

(51) Int. Cl.
    *C09K 13/00*    (2006.01)

(52) U.S. Cl. .................... 252/79.1; 252/79.2; 252/79.4

(58) Field of Classification Search ................. 216/88, 216/89, 100, 108, 109; 252/79.1, 79.2, 79.4

See application file for complete search history.

(56) References Cited

U.S. PATENT DOCUMENTS

| | | | | |
|---|---|---|---|---|
| 4,002,487 A | * | 1/1977 | Conley | 106/488 |
| 4,678,541 A | * | 7/1987 | Tytgat et al. | 216/108 |
| 5,225,034 A | * | 7/1993 | Yu et al. | 438/693 |
| 5,527,423 A | * | 6/1996 | Neville et al. | 438/693 |
| 5,653,623 A | * | 8/1997 | Kimura et al. | 451/72 |
| 5,735,963 A | * | 4/1998 | Obeng | 134/3 |
| 6,030,932 A | * | 2/2000 | Leon et al. | 510/175 |
| 6,117,783 A | * | 9/2000 | Small et al. | 438/693 |
| 6,156,661 A | * | 12/2000 | Small | 438/692 |
| 6,251,150 B1 | * | 6/2001 | Small et al. | 51/307 |
| 6,293,848 B1 | * | 9/2001 | Fang et al. | 451/36 |
| 6,313,039 B1 | * | 11/2001 | Small et al. | 438/693 |
| 6,347,978 B1 | * | 2/2002 | Fang et al. | 451/28 |
| 6,793,559 B2 | * | 9/2004 | Fang et al. | 451/41 |
| 2002/0111024 A1 | * | 8/2002 | Small et al. | 438/689 |
| 2003/0131535 A1 | * | 7/2003 | Small et al. | 51/307 |
| 2003/0164471 A1 | * | 9/2003 | Small et al. | 252/79.1 |

FOREIGN PATENT DOCUMENTS

| | | | |
|---|---|---|---|
| CZ | 278402 B6 | * | 12/1993 |
| DE | 1190293 | * | 4/1965 |
| JP | 03256665 A | * | 11/1991 |

* cited by examiner

*Primary Examiner*—Anita Alanko
(74) *Attorney, Agent, or Firm*—Morgan Lewis & Bockius LLP

(57) ABSTRACT

A composition for chemical mechanical polishing includes a slurry. A sufficient amount of a selectively oxidizing and reducing compound is provided in the composition to produce a differential removal of a metal and a dielectric material. A pH adjusting compound adjusts the pH of the composition to provide a pH that makes the selectively oxidizing and reducing compound provide the differential removal of the metal and the dielectric material. A composition for chemical mechanical polishing is improved by including an effective amount for chemical mechanical polishing of a hydroxylamine compound, ammonium persulfate, a compound which is an indirect source of hydrogen peroxide, a peracetic acid or periodic acid. A method for chemical mechanical polishing comprises applying a slurry to a metal and dielectric material surface to produce mechanical removal of the metal and the dielectric material. A selectively oxidizing and reducing compound is applied to produce a differential removal of the metal and the dielectric material. The pH of the slurry and the selectively oxidizing and reducing compound is adjusted to provide the differential removal of the metal and the dielectric material. A method for chemical mechanical polishing comprises applying a slurry to a metal and dielectric material surface to produce mechanical removal of the metal and the dielectric material, and an effective amount for chemical mechanical polishing of a hydroxylamine compound, ammonium persulfate, a compound which is an indirect source of hydrogen peroxide, a peracetic acid or periodic acid.

20 Claims, 2 Drawing Sheets

CHEMICAL MECHANICAL POLISHING COMPOSITION AND PROCESS

CROSS REFERENCE TO RELATED APPLICATIONS

This application is a continuation of application Ser. No. 09/226,996, filed Jan. 7, 1999 now U.S. Pat. No. 6,635,186, which is a continuation of application Ser. No. 09/043,505, filed Mar. 23, 1998, which issued as U.S. Pat. No. 6,117,783 on Sep. 12, 2000, which claims priority to PCT International Application No. PCT/US97/12220, filed Jul. 21, 1997, which claims the benefit of provisional application no. 60/023,299, filed Jul. 26, 1996.

INTRODUCTION

1. Technical Field

This invention relates to an improved composition and process for the chemical mechanical polishing or planarization of semiconductor wafers. More particularly, it relates to such a composition and process which are tailored to meet more stringent requirements of advanced integrated circuit fabrication.

2. Background

Chemical mechanical polishing (or planarization) (CMP) is a rapidly growing segment of the semiconductor industry. CMP provides global planarization on the wafer surface (millimeters in area instead of the usual nanometer dimensions). This planarity improves the coverage of the wafer with dielectric (insulators) and metal substrates and increases lithography, etching and deposition process latitudes. Numerous equipment companies and consumables producers (slurries, polishing pads, etc.) are entering the market.

CMP has been evolving for the last ten years and has been adapted for the planarization of inter-layer dielectrics (ILD) and for multilayered metal (MLM) structures. During the 80's, IBM developed the fundamentals for the CMP process. Previously (and still used in many fabs today) plasma etching or reactive ion etching (RIE), SOG ("spin on glass"), or reflow, e.g., with boron phosphorous spin on glass (BPSG), were the only methods for achieving some type of local planarization. Global planarization deals with the entire chip while "local" planarization normally only covers a ~50 micron$^2$ area.

At the 1991 VMIC Conference in Santa Clara, Calif., IBM presented the first data about CMP processes. In 1993 at the VMIC Conference, IBM showed that a copper damascene (laying metal lines in an insulator trench) process was feasible for the MLM requirements with CMP processing steps. In 1995 the first tungsten polishing slurry was commercialized.

The National Technology Roadmap for the Semiconductor Industries (1994) indicates that the current computer chips with 0.35 micron feature sizes will be reduced to 0.18 micron feature size in 2001. The DRAM chip will have a memory of 1 gigabit, and a typical CPU will have 13 million transistors/cm$^2$ (currently they only contain 4 million). The number of metal layers (the "wires") will increase from the current 2-3 to 5-6 and the operating frequency, which is currently 200 MHz, will increase to 500 MHz. This will increase the need for a three dimensional construction on the wafer chip to reduce delays of the electrical signals. Currently there are about 840 meters of "wires"/chip, but by 2001 (without any significant design changes) a typical chip would have 10,000 meters. This length of wire would severely compromise the chip's speed performance.

The global planarization required for today's wafer CDs (critical dimensions) improves the depth of focus, resulting in better thin metal film deposition and step coverage and subsequently increases wafer yields and lowers the cost/device. It is currently estimated (1996) that it costs $~114/layer/wafer with current limited planarization processes. As the geometries become smaller than 0.35 micron, the planarity requirements for better lithography become critical. CMP is becoming important, if not essential, for multiple metal levels and damascene processes.

The CMP process would appear to be the simple rotation of a wafer on a rotary platen in the presence of a polishing medium and a polishing pad that grinds (chips away) the surface material. The CMP process is actually considered to be a two part mechanism: step one consists of chemically modifying the surface of the material and then in the final step the altered material is removed by mechanical grinding. The challenge of the process is to control the chemical attack of the substrate and the rate of the grinding and yet maintain a high selectivity (preference) for removing the offending wafer features without significant damage to the desired features. The CMP process is very much like a controlled corrosion process.

An added complexity is that the wafer is actually a complex sandwich of materials with widely differing mechanical, electrical and chemical characteristics, all built on an extremely thin substrate that is flexible.

The CMP processes are very sensitive to structural pattern density which will affect metal structure "dishing" and oxide erosion. Large area features are planarized slower than small area features.

At the recent SEMICON/Southwest 95 Technical program on CMP, it was stated that "Metal CMP has an opportunity to become the principal process for conductor definition in deep submicron integrated circuits." Whether or not it does so depends on the relative success of CMP technologists in achieving the successful integrated process flow at competitive cost.

Slurries: CMP has been successfully applied to the planarization of interdielectric levels (IDL) of silicon oxides, BPSG, and silicon nitride and also metal films. The metal films currently being studied include tungsten (W), aluminum (Al) and copper (Cu).

The polishing slurries are a critical part of the CMP process. The polishing slurries consist of an abrasive suspension (silica, alumina, etc.) usually in a water solution. The type and size of the abrasive, the solution pH and presence of (or lack of) oxidizing chemistry are very important to the success of the CMP process.

Metal CMP slurries must have a high selectivity for removing the unwanted metal compared to the dielectric features on the wafers. The metal removal rate should be between 1700 to 3500 Å/min) without excessive "dishing" of the metal plugs or erosion of the oxide substrate.

The oxide CMP has similar requirements and polishing rates close to 1700 Å/minute.

Metal Polishing: This type of polishing relies on the oxidation of the metal surface and the subsequent abrasion of the oxide surface with an emulsion slurry. In this mechanism, the chemistry's pH is important. The general equations are (M=metal atom):

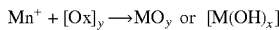

Under ideal conditions the rate of metal oxide ($MO_y$) formation ($V_f$) will equal the rate of oxide polishing ($V_p$), ($V_f=V_p$). If the pH is too low (acidic) then the chemistry can rapidly penetrate the oxide and attack the metal ($V_f<V_p$), thus exposing the metal without any further oxide formation. This means that all metal surfaces, at high points and in valleys, are removed at the same rate. Planarization of the surface is not achieved. This could cause metal plug connectors to be recessed below ("dishing") the planarization surface which will lead eventually to poor step coverage and possible poor contact resistance.

When the pH is too high (caustic), then the oxide layer may become impenetrable to the chemistry and the metal becomes passive, ($V_f>V_p$) and the metal polishing rate becomes slow. Metal polishing selectivity to oxide generally ranges from 20 to 100:1, depending on the metal type. Tungsten metal should have selectivities >50:1 for the metal to oxide, and copper could have >140:1 metal to oxide selectivity. Etch rates can be up to 7000 Å/min. The chemical diffusion rate and the type of metal oxide surface are important to the successful planarization process. A detailed mechanism has been proposed by Kaufman.

In practice, the low pH and highly corrosive oxidants (ferric nitrate) being used with an example metal CMP process has created corrosion problems with the polishing equipment. Currently the oxidant used in the metal polishing step has ranged from nitric acid to hydrogen peroxide, cesium and ferric nitrate solutions and even ferric cyanide solutions. Because of chemical stability problems, many slurries are made up at the point of use which means that there is little or no shelf life.

Metal planarization needs an oxidizing reagent that is stable and is not going to contribute to mobile ion contamination, will not "stain" the equipment, will not affect the slurry composition and slurry particle distribution and is generally environmentally friendly. The current hydrogen peroxide systems are not stable when premixed with the slurry and therefore have to be delivered to the polishing equipment with separate pumping systems and mixed at the point of use. The ferric nitrate system requires a low pH and is known to "stain" the polishing equipment. The potassium iodate system also requires special handling.

An emerging area of CMP will deal with the copper damascene process. The copper metal interconnects (wires) will be required because of its better conductivity compared to Al. One major disadvantage with copper is its easy diffusion through silica under normal operating conditions. The copper damascene process will need barrier layers to prevent this copper diffusion.

In the damascene process, "lines" or trenches are etched into the interdielectric layers, and then the walls of these trenches are coated with barrier materials. These materials can be composed of Ta, TaN, Ti or TiN among other materials. Copper metal is then deposited, by electroless or electrode plating, or PVD or CVD methods. The excess copper above the trench is then removed by chemical mechanical polishing. The difficult part of the CMP process is not to remove excess copper ("dishing") which will remove the copper metal below the interdielectric layer.

CMP of the copper metal can be done over a wide pH range (2 to 12). Pourbaix diagrams for copper indicate that copper can only be passivated (oxide layer) in neutral or basic solutions. In acid solutions an inhibitor, i.e., benzotriazole (BTA) is usually needed to control the isotropic etching effects from the chemistries used in the CMP process. Much of the CMP work has been done with hydrogen peroxide at various pH ranges.

Some CMP work has been done with ammonium hydroxide, because of its ability to form copper complexes though there are problems with poor selectivity between copper and titanium and silicon oxide.

Interlayer Dielectric (Oxide) Polishing: Recently a group of engineers using ILD (oxide) CMP was asked to prioritize CMP processing requirements. The major concern was surface damage (scratching, etc.) followed by wafer (polishing) nonuniformity (within wafer and wafer to wafer), then polishing rate and finally planarity. The mechanisms are still being developed, but the polishing process appears to involve two concurrent processes; a mechanical process involving plastic deformation of the surface and, chemical attack by hydroxide (—OH) to form silanol bonds.

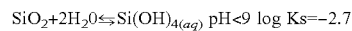

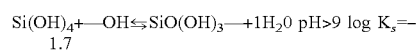

$SiO(OH)_3^- \rightarrow$ polynuclear species pH>10.5

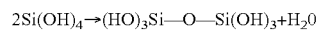

In a slurry (colloidal suspension) the pH is important and for the silicon oxide system it needs to be in the 10 to 11.5 range. Currently CMP users are using silicon oxide-based slurries which were "buffered" with sodium hydroxide but now are being formulated with potassium or ammonium hydroxide solutions. Etch rates can be in the range of 1700 Å/min.

If the pH is too high the polynuclear species may start to precipitate in an unpredictable manner. There is also the possibility of a condensation process to form Si bonds.

There are other important features of the silicon surface that will influence the etch rates and final surface conditions; (metal contamination and possibly micro scratches). As mentioned above the typical silicon surface is terminated (covered) with —OH groups under neutral or basic conditions. The silicon surface is hydrophilic (the surface is "wettable"). These groups activate the surface to a number of possible chemical or physioabsorbtion phenomena. The Si—OH groups impart a weak acid effect which allows for the formation of salts and to exchange the proton ($H^+$) for various metals (similar to the ion exchange resins). These Si—O⁻ and Si—OH can also act as ligands for complexing Al, Fe, Cu, Sn and Ca. Of course the surface is very dipolar and so electrostatic charges can accumulate or be dissipated depending on the bulk solution's pH, ion concentration and charge. This accumulated surface charge can be measured as the Zeta potential.

If the silica (Si) surface underneath the oxide layer is exposed because of an over aggressive polishing process, this could cause electrochemical problems because silica has a modest redox potential which will allow Cu, Au, Pt, Pb, Hg and Ag to "plate on" the silica surface. Exposure to light will also affect the redox reaction for Cu. The light will "generate" electrons in the semiconductor Si material which then reduces the copper ion to $Cu°$.

Post-Clean Processes: Both the ILD and metal polishing processes must eventually pass through a final cleaning step to remove traces of slurry and the chemistry. Though the process appears to be simple, i.e. a brush scrub and a rinse cycle, considerable effort is being expended to determine if the process should involve either single side, double sided scrubbing, single wafer or batch processing, spray tools or even immersion tanks. Recently an engineering group working with post-clean CMP ranked wafer cleanliness (from slurry and pad particles and metallic contamination) as the most important issue in the post-clean step. Process reliability and defect metrology were the other two important areas of concern.

Residual particle levels must be ~1 particle/20 $cm^2$, and 90% of these particles with less than >0.2 micron size. Line widths of 0.35 micron will require the removal of particles down to 0.035 or less. Incomplete particle removal will decrease wafer yield. Low defect (scratches) levels and acceptable planarity will also be very important.

Most fabs have developed their own in-house technology for the post-clean CMP steps. Most of the "chemistries" involve DI water with either added ammonium hydroxide or HF while some fabs are using the standard RCA SC-1 ($NH_4OH:H_2O_2:H_2O$) and SC-2 ($HCl:H_2O_2:H_2O$) cleaning steps traditionally used in the front end process.

There are five mechanisms for removing impurities (particles and/or ions) from wafer surfaces:

Physical desorption by solvents: Replacing a small number of strongly absorbed material with a large volume of weakly adsorbed solvent (changing the interaction of the surface charges).

Change the surface charge with either acids or bases: The Si—OH or M—OH group can be protonated (made positive) in acid or made negative with bases by removing the proton.

Ion competition: Removing adsorbed metal ions by adding acid (i.e. ion exchange).

Oxidation or decomposition of impurities: Oxidation of metals, organic materials or the surface of slurry particles will change the chemical bonds between the impurities and substrate surface. The chemical reaction can either be through redox chemistry or free radicals.

Etching the surface: The impurity and a certain thickness of the substrate surface is dissolved.

SUMMARY OF THE INVENTION

In accordance with a first aspect of the invention, a composition for chemical mechanical polishing includes a slurry. A sufficient amount of a selectively oxidizing and reducing compound is provided in the composition to produce a differential removal of a metal and a dielectric material. A pH adjusting compound adjusts the pH of the composition to provide a pH that makes the selectively oxidizing and reducing compound provide the differential removal of the metal and the dielectric material.

In accordance with a second aspect of the invention, a composition for chemical mechanical polishing is improved by including an effective amount for chemical mechanical polishing of a hydroxylamine compound.

In accordance with a third aspect of the invention, a composition for chemical mechanical polishing is improved by including ammonium persulfate.

In accordance with a fourth aspect of the invention, a composition for chemical mechanical polishing is improved by including a compound which is an indirect source of hydrogen peroxide.

In accordance with a fifth aspect of the invention, a composition for chemical mechanical polishing is improved by including a peracetic acid.

In accordance with a sixth aspect of the invention, a composition for chemical mechanical polishing is improved by including periodic acid.

In accordance with a seventh aspect of the invention, a method for chemical mechanical polishing comprises applying a slurry to a metal and dielectric material surface to produce mechanical removal of the metal and the dielectric material. A selectively oxidizing and reducing compound is applied to produce a differential removal of the metal and the dielectric material. The pH of the slurry and the selectively oxidizing and reducing compound is adjusted to provide the differential removal of the metal and the dielectric material.

In accordance with an eighth aspect of the invention, a method for chemical mechanical polishing comprises applying a slurry to a metal and dielectric material surface to produce mechanical removal of the metal and the dielectric material, and an effective amount for chemical mechanical polishing of a hydroxylamine compound.

In accordance with an ninth aspect of the invention, a method for chemical mechanical polishing comprises applying a slurry to a metal and dielectric material surface to produce mechanical removal of the metal and the dielectric material, and an effective amount for chemical mechanical polishing of ammonium persulfate.

In accordance with a tenth aspect of the invention, a method for chemical mechanical polishing comprises applying a slurry to a metal and dielectric material surface to produce mechanical removal of the metal and the dielectric material, and an effective amount for chemical mechanical polishing of a compound which is an indirect source of hydrogen peroxide.

In accordance with an eleventh aspect of the invention, a method for chemical mechanical polishing comprises applying a slurry to a metal and dielectric material surface to produce mechanical removal of the metal and the dielectric material, and an effective amount for chemical mechanical polishing of a peracetic acid.

In accordance with an twelfth aspect of the invention, a method for chemical mechanical polishing comprises applying a slurry to a metal and dielectric material surface to produce mechanical removal of the metal and the dielectric material, and an effective amount for chemical mechanical polishing of periodic acid.

DETAILED DESCRIPTION OF THE INVENTION

Figure 1:
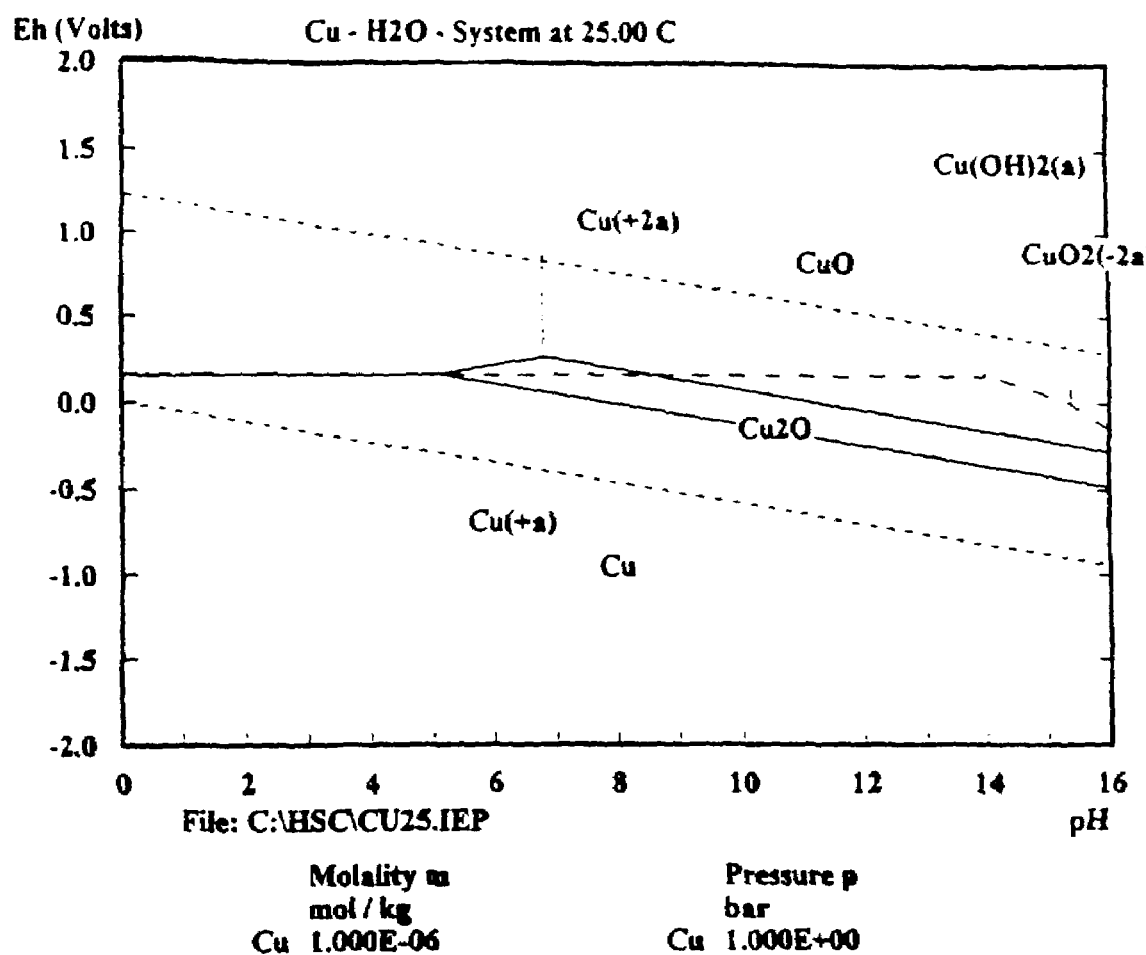
FIGS. 1 and 2 are Pourbaix diagrams for copper and metal, useful for an understanding of the invention.

Now CMP appears to be entering a new growth phase, which emphasizes a new group of priorities. These priorities include reducing CMP defects in metal and insulator layers, better planarity within wafer and wafer to wafer, a premixed concentrate that avoids point of use mixing; a generic post CMP cleaning and a high polishing selectivity. There are also environmental, health and safety issues. These issues are: (1) better vapor handling (or reduced requirement for vapor handling), (2) possible slurry recycling (or spent slurry residues that are more environmentally friendly), (3) more stable chemistries to be used with the abrasives and (4) better end point detection (EPD) during the polishing steps.

This invention does not deal with the composition or type of abrasive (slurry particle size, shape, size distribution, % solids) in the slurry. But the slurries have numerous other components (oxidizing agents, stabilizers, etc.) that can be improved through additional experiments. These components include solution pH, type of chemistry and chemical and slurry purity. This proposed invention focuses on the chemistry and its possible pH, Zeta potential, contact angle ("wetting") and other associated effects.

The first phase of the invention focuses on understanding the CMP chemistry based on hydroxylamine (HDA) and hydroxylamine derivatives (the chloride, sulfate, nitrate or other salts) under different pH conditions. HDA (NH2OH) can be viewed a hybrid between hydrazine (NH2NH2) and hydrogen peroxide (H2O2) in its redox chemistry. HDA is a more selective (controllable) oxidation and reducing agent. This dual capability is achieved by shifting the pH from the acid to basic media, i.e.

$Cu^{+2}(NH_4OH) \rightarrow Cu^+$ pH 9-11 $E_v = -0.08$ Reduction $Cu^+(H_2SO_4) \rightarrow Cu^{+2}$ pH 0-1 $E_v = +0.34$ Oxidation The redox potential for hydrogen peroxide (acidic) and HDA (in acid and base) ($E_v$ at SHE) are given:

$H_2O_2 \rightarrow O_2 + 2H^+ + 2e^-$ $E_v = +0.68$ $2NH_2OH + 4OH^- \rightarrow N_2O + 5H_2O + 4e^-$ $E_v = -1.05$ $2NH_3OH^+ \rightarrow N_2O + 6H^+ + H_2O + 4e^-$ $E_v = -0.05$ Fortunately few metal ions are reduced to the zero oxidation state, and this is important in CMP processes to avoid contamination of the wafer surface with metal particles. Hydrogen peroxide polishing systems are also not very stable, being easily decomposed by trace amounts of transition metals. Currently, the CMP consumable suppliers need to have a two component delivery system—one for the slurry and the second for the peroxide.

Besides being a redox agent, HDA, like ammonia, can form complex salts with many metals including $Al(SO_4)_2 * NH_2OH * H_2O$ and $Cu(x)_2 * NH_2OH * H_2O$.

Another important advantage of using hydroxylamine type compounds is their decomposition products. Depending on the solution pH and metal ions and concentration, HDA will decompose to water, nitrogen, ammonia and $N_2O$. The formation of nitrogen even takes place through a slow internal redox reaction at pHs above 8.

Metal Polishing: The metals currently being studied for the CMP process include Al, Cu, and W. Pourbaix diagrams can be used to examine the best regions ($E_v$ versus pH) for the various polishing rates (corrosion). No two metal or alloy systems will have the same regions of chemical activity. Using this data may also allow CMP polishing conditions to be chosen so that the selectivity of the polishing rate of one metal is significantly greater than another metal (or oxide or nitride material) on the same wafer. Pourbaix diagrams can be obtained for all metals, oxides, nitrides and other materials appearing on wafer surfaces wherever they are available. By overlaying the diagrams, pH regions can be roughly determined which may be corrosive for one material while passivating for another. This could be one tool that is useful in seeking high selectivities. FIG. 1 shows the Pourbaix diagram for Cu. This diagram, based on thermodynamic data, shows that copper, copper (I) oxide and copper (II) oxide can exist together in the redox environment of our world (delineated by the sloping parallel dashed lines). The data also shows that none of these three compounds can exist at pHs less than 6.8, and at oxidation potentials above ~0.2 volts, all of these compounds will dissolve.

At higher pH values the three compounds can exist in aqueous solution, including with various anions ($Cu(OH)_2$ and $CuO_2^-$.

This invention proposes that usage of HDA or its salts can be used to remove copper using CMP methods. The advantage of using the HDA based chemistries is that its oxidation potential ($E_v = -1.05$ volts) will allow the Cu to be removed at higher pHs than conventional chemistries that require a more acidic environment (lower pH).

Recent experiments with 10% hydroxylamine nitrate in DI water showed that 3000 A copper metal on a 300 A Ti metal layer could be cleanly removed; @ pH 3~100 A/min, pH 4~125 A/min and pH 5~1000 A/min. This is exactly the reverse of the expected pH effect from the Pourbaix diagram and is the result of the oxidation potential.

When the free base hydroxylamine (5% in DI water) was tested with the same type of copper wafer, the etching rate dropped to 75 A/min compared to a 10% ammonium hydroxide with a 100 A/min rate. It is known that ammonium hydroxide solutions will dissolve copper very slowly, but if oxidizing agents (air or oxygen) are introduced then the etching rate can be quite measurable. The hydroxylamine solution is a reducing medium and so the copper etch is slower. The data does show that HDA could be used for very controlled (slow) etch rates.

Figure 2:
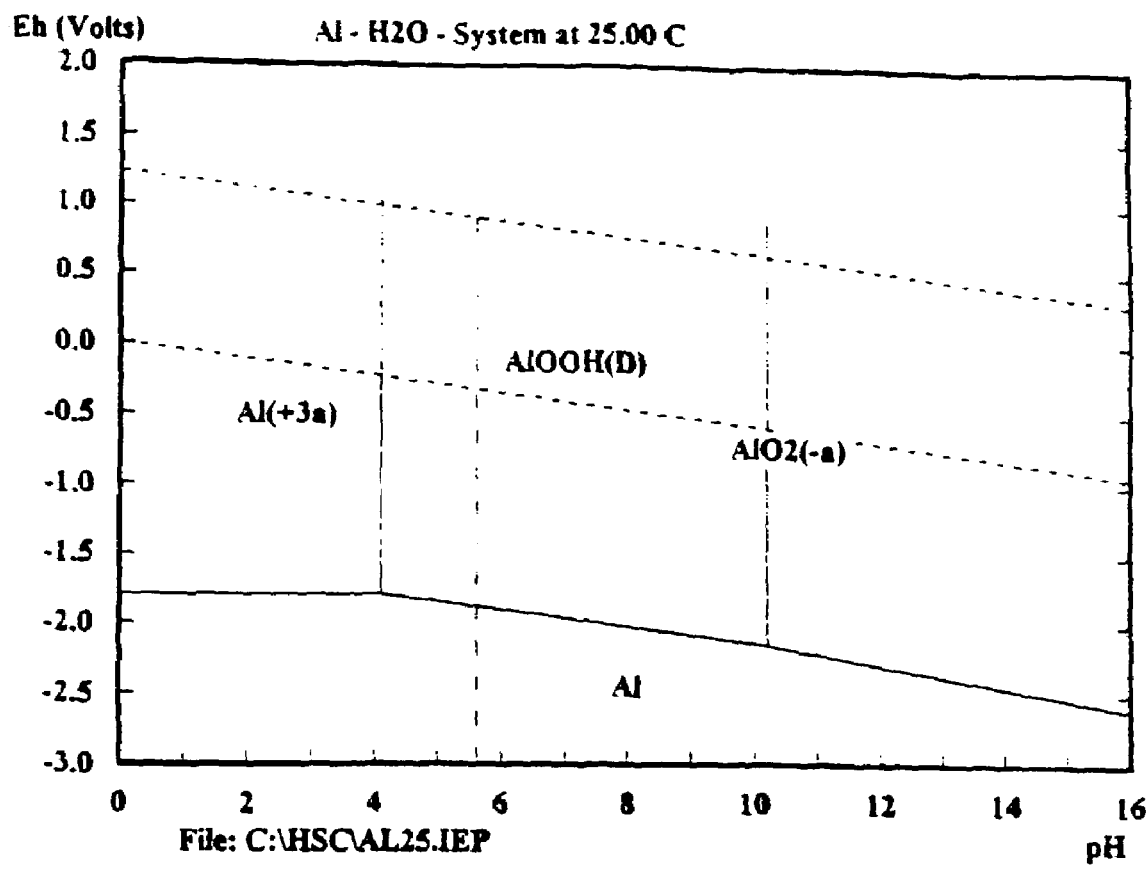

FIG. 2 shows the Pourbaix diagram for aluminum metal. The data shows that the pure metal Al cannot exist in the normal redox regime but only as an oxide coating. Between a pH of 4 and 10 this oxide layer will not dissolve. Experiments with blanket Al metal wafers should again show the Al metal and its oxide layer can be removed by using either HAN at a pH of 4 or at 10 since it is necessary to remove the oxide layer before the metal layer can be polished. Concentration ranges will vary from 0.5 to 10 wt %.

Our understanding of HDA and its purification has given us a unique understanding of HDA's capacities to aid in removing mobile ions (sodium, potassium, iron and other transition metal ions) from the wafer's surface. It is critical that all phases of the CMP process minimize the mobile and transition metal ion concentrations on the wafer surfaces.

It is possible to add chelating agents; i.e. alkyl beta-diketones (2,4 pentanedione, etc.) or EDTA or aromatic phenolic aldehydes (salicylaldehyde, etc.) or other agents. These components can be added in concentrations ranging from 2 ppm to 15 wt %. Higher concentrations could be used but there is a possibility that these chelators could "plate" on the chip's structures, or would alter the effectiveness of the over all chemistry. The ketone-based systems may react with the hydroxylamine based products to form oxime derivatives which are good chelating agents in their own right.

Other agents could include bis(hydroxypropyl)hydroxylamine, anisaldehyde or even alpha hydroxy isobutyric acid as a chelator. Other compounds could also be aromatic dioxygenated compounds, benzoin and benzil.

A recently reported water soluble iron chelator is O-TRENSOX which can be used in the HDA-based chemistries and should show promising results.

Though catechol and catechol derivatives are known to be good chelating agents at high pH conditions (because of the mono or dianion) only a little work has been done with this class of compounds under acidic conditions. There are reports that catechol will complex with aluminum at pH 3-5.

Gallic acid is also another compound that under mildly acidic conditions could have complexing powers with certain Group 3 through 12 metals (IUPAC nomenclature). The catechol and gallic acid family of compounds can act as either corrosion inhibitors (at "high" concentrations; i.e. 0.5 to 15-20 wt %) compounds, or as metal chelators in the ppm to 0.5 wt % range.

For many oxygenated compounds (phenols, alcohols, some organic acids, etc.) it is important that the oxygen atoms fill in vacancies on the metal surfaces. These vacancies are formed because of poorly organized surface oxide films and/or the pH retards the reactions or other anions interfere with the film uniformity. If the chemical environment is too aggressive then the corrosion inhibitor that is absorbed on the surface will be dissociated from the surface, but will carry a metal ion with it. Now the corrosion inhibitor can give the appearance of an attacking species.

Other benefits to using HDA-based chemistries are the environment, safety and health aspects. HDA under basic conditions decomposes to water, nitrogen, and small concentrations of $NH_3$. HDA is mildly caustic compared to other nitrogen containing compounds, i.e., organic amines. Under acidic conditions, hydroxylamine compounds are very stable in aqueous solutions.

CMP users do not like working with sodium or potassium hydroxide because of the potential mobile ion contamination. Many users have changed over to ammonium hydroxide which does not have the same magnitude of a mobile ion problem and does have a lower surface tension (better surface contact). The main problem with ammonium hydroxide is its odor which requires very effective ventilation systems.

Another important area is to understand and, if possible, to adjust the slurries' Zeta potential. The Zeta potential is a electrostatic potential measurement of the interaction of the electrostatic double layer ions (anions and cations) that exists around each particle in a solution. The Zeta potential depending on the type of particle; i.e. aluminum, silica, manganese dioxide etc., and the solution pH, can be positive or negative. Poorly designed slurries may have a Zeta potential which leads to settling of the slurry particles. This can be very detrimental to its performance during the CMP polishing process.

Another measure of Zeta potential is the isoelectric point (IEP) for a particle. The IEP is the pH at which the Zeta potential value is zero. The chemical composition and source will have significant effect on the IEP. Some selected values: aluminum oxide particles can vary between 3.8 to 9.4, while silicon oxide has a narrower range 1.5 to 3.7.

Some metal residue IEP values are 9.5 for $TiO_2$, while tungsten is somewhere around ~1. Such wide ranges of values pose a major challenge to developing chemistries to control the Zeta potential of the particles that may eventually adhere to the wafer surface.

Another concern is that the Zeta potential between the slurry and metal particles and the wafer will be such that the particles will be attracted and adhere to the wafer surface. This will require that a post CMP clean step remove the adhering particles.

The hydroxylamine or hydroxylamine salts can react with the particle surface through either a redox reaction or a normal chemical reaction with the terminal groups on the surface. Since the HDA chemistries can be chemically "tuned" by adjusting the pH and still be active for metal CMP (see Cu idea above), this will give us a wider process window to affect the solution slurry Zeta potential. Concentrations for this effect should be between 1 to 10 wt % because of HDA's single charge.

Another way to change the Zeta potential is to use surfactants (nonionic, cationic or anion) to reduce the surface charge on the wafer. The hydroxylamine chemistries can be matched with the appropriate surfactant. Experiments with octylphenol polyethylene (9-10 ethylene oxide units) at pH 9.5 did reduce the surface tension and also reduced surface roughness. Anionic surfactants can be used for particles that have positive Zeta potentials.

Oxide Polishing: Some of the films currently being planarized include TEOS, BPSG, PSG and SOG. Though this area of CMP has matured, EKC's HDA (50% hydroxylamine) chemistry with its "buffered" pH of 9.5 to 10.5, and low mobile ion concentration (Na and K) could be an important new chemistry for the current silicon oxide slurries.

The HDA free base material should be tested at various pH's (7-11) with a silica slurry. The amount of HDA used in the slurry should be ~2 to 10%. SIMS data should show that the mobile ion content remained constant or was decreased.

Though ammonium hydroxide solutions will also polish the silicon surface, the vapors from the polishing process need to be handled (removed) in an effective manner. The HDA chemistries do not have the same smell intensity.

Work with ammonium salts added to fumed silica, in the pH range of 6-9 for oxide CMP slurry, shows surprising results. Though one expects the higher pH (9) to polish silicon oxide faster (traditional chemical attack of a base on the Si bond), Hayashi et al. had remarkable success at removing oxide at a pH 6 with a 0.1 molar ammonium salt solution (chloride, sulfate, etc). Even at pH 7 the rate was faster that at pH 9. The results suggest particle agglomeration (change in the electrical double layer by modifying the Zeta potential of the fumed silica), forming a "slush" on the particles and the oxide surface. It was also noticed that the residual particle count was reduced from $5 \times 10^5$ to $2 \times 10^3$ for a 6" wafer. There is no reason that hydroxylamine salts at this or smaller concentration ranges should not have a similar effect on the polishing rate. The $pK_b$'s between the two groups of salts are different which would allow us again to "fine tune" the polishing rates.

One theory is that colloidal silica is very sensitive to pH and undergoes flocculation at pH values near 8, due to the presence of insufficient alkali ions.

Ammonium bifluoride is another important ingredient to be evaluated in the above matrix. Silica dioxide has several solubility regions depending on pH. Ammonium bifluoride at low concentrations ($>1 \times 10^{-3}$ molar) and low pH (4-6) can be effective for expanding the "window" for dissolving silica structures. This chemistry region might open up an entirely new CMP processing window for ILD. The concentration ranges must be rather narrow, i.e., $1 \times 10^{-5}$ to $1 \times 10^{-2}$ molar. At higher concentrations the chemistries start to act as conventional HF etching media (in the pH range 4-7) with very rapid etching.

One important area is the polishing of an oxide/nitride system and being able to achieve a high oxide to nitride selectivity. Nitride appears to undergoing slow oxidation to a silicon oxide type compound which undergoes the standard oxide polishing process. This reduces the desired polishing selectivity.

Since the HDA free base is a saturated nitrogen solution, and the free base reacts with oxygen thus creating a solution with very poor oxidizing potentials, it is possible that the nitride structures will not be readily attacked. Thus the oxide to nitride polishing selectivity should be enhanced.

Research would also be directed at determining if the HDA solutions are stable under the required CMP conditions and whether there is an enhanced selectivity among various other silicon oxide systems (SOG, TEOS, BPSG, etc.).

Post-CMP Clean: The chemical nature of the wafer surface (hydrophilic or hydrophobic) will effect the method and type of solution necessary to remove particles from the wafer surface after the polishing step. The particle charge relative to the wafer surface will determine the type of chemistry that will effectively remove the particles. Zeta potentials of the particles and the effect of the solution pH on this value will need to be understood. Alumina particles can be dislodged under acid conditions but silicon oxide material requires a basic solution.

At the same time it should be advantageous to use solution additives to remove metal contaminates from the wafer surface. Study of residual particle count and metal contamination levels on wafers from a post-clean procedure allows correlation of this information with the HDA solution pH and level of additives. These additives will include water soluble crown ethers and specific metal chelating agents or buffered citric acid solutions.

Though HDA and HDA related compounds can effect the particle and wafer surfaces through pH and redox chemistries, these chemical species only have a single ionic charge per molecule (though a reasonable charge density for the size of molecule involved). It may be necessary to augment the electrostatic double layer around the particles or on the wafer by adding "polyelectrolytes" which are highly charged compounds. Normally the polyelectrolytes are used in high enough concentration to "force" particles to clump together. In this invention we only want to add enough polyelectrolytes encourage the particles to repel each other and away from the wafer surfaces. This will enhance the post CMP cleaning step. The concentration for this affect could range from 1 part per thousand to 10 wt %.

There are several other types of redox reagents that also can be used in CMP applications which could be used by themselves or in conjunction with other chemistries, including hydroxylamine and its salts.

In accordance with another aspect of the invention, ammonium persulfate (ammonium peroxydisulfate) can be used to remove Al, copper or tungsten using CMP methods. Though ammonium persulfate has been used to strip copper metal films from electronic component boards, this material has not been used to remove Cu in a very controlled manner. We are not aware of this chemistry being used to polish Al metal under CMP process conditions.

The tungsten CMP process appears to operate through the tungstate ($WO_4^=$) ion. Though the current CMP processes are based on ferric nitrate or hydrogen peroxide under acid conditions another feasible route to obtain this species is to oxidize the W metal with an oxidizing agent under basic conditions. The tungstate should have maximum solubility at pH>6.

Normally ammonium persulfate solutions have a pH in the range of 2 to 3. This invention illustrates that by adjusting the oxidizing solution's pH to higher values, the resulting solution will be a very effective for polishing W metal films.

EXAMPLES

The following non-limiting examples represent best modes contemplated by the inventors and describe the invention further. In these examples, solution chemistry was tested as follows:

Example 1

Test: Solutions of ammonium persulfate were prepared and then added to a 5% alumina slurry. The pHs were adjusted with NaOH just before use.

The CMP experiments were with 10,000 Å tungsten wafers, at 33 rpm and 2 psig. The pad was a Rodell RC 1000 on a Logitech P5M polisher. Base line polishing experiments with only an alumina slurry have determined that there is an 8× to 10× polishing factor between the Logitech and the IPEC/Westech industrial size CMP polisher.

| 10% solution | pH 3   | removal rate 112 Å |
| 10% solution | pH 6   | removal rate 105 Å |
| 10% solution | pH 7.7 | removal rate 196 Å |
| 10% solution | pH 7.9 | removal rate 198 Å |
| 5% solution  | pH 9   | removal rate 176 Å |

Notice that there appears to be a maximum value at a pH around 7.9.

Example 2

Test: Another composition that was tested was composed of ammonium persulfate (APS) with varying concentrations of malonic acid (MA). The pH was adjusted with sodium hydroxide. Ammonium hydroxide will be oxidized to nitrogen and water.

| APS | MA   | pH  | Etch Rate (Å/min) |
|-----|------|-----|-------------------|
| 10% | 1%   | 6   | 162               |
| 10% | 1%   | 8.1 | 460               |
| 10% | 0.4% | 8   | 291               |
| 5%  | 1%   | 8.8 | 265               |
| 10% | 0%   | 8   | 162               |

Notice that the best etch rates are seen at pH's above 8 and that malonic acid does have a positive effect (10% APS, 0% MA, etch rate 162 Å/min), compared to the 5%, 1% MA solution (265 Å/min).

There are other additives that can be added to oxidizers that can also be used in the CMP process. These additives can include oxalic acid, lactic acid, gluconic acid, malonamide, and citric acid. These organic acids should have $pK_a$ lower than the pH of the planarization solution. It is desirable to have these acids in their corresponding anion form, which should be the most effective chelation species.

In addition to malonic acid ($HO_2CCH_2CO_2H$), APS can be used effectively for W CMP when combined with other organic acids: succinic acid ($HO_2CCH_2CH_2CO_2H$), tartaric acid ($HO_2CCH(OH)CH(OH)CO_2H$), citric acid ($HO_2CCH_2C(OH)(CO_2H)CH_2CO_2H$), and oxalic acid ($HO_2CCO_2H$).

Bases that can be used to adjust the oxidizing solution's pH, include sodium hydroxide, potassium hydroxide, magnesium hydroxide, magnesium carbonate and imidazole among others.

There are other potential oxidizer compounds that can be included:

Peroxymonosulfuric acid (Caro's acid) ($H_2SO_5$) or its salts are very strong oxidizing agents, (E°=−1.44V). The acid form has one proton with a dissociation constant similar to sulfuric acid while the second proton has a $pK_a$ of only 9.4.

Example 3

A commercial product Caroat (potassium peroxomonosulfate compound, including the potassium salt of Caro's acid; empirical formula $2KHSO_6KHSO_4K_2SO_4$) is a good oxidizer in aqueous system at low pH, but combined with APS, it shows promising results for W CMP at higher pH values. Caroat is a registered product of Degussa Corporation. The following removal rates are for the Logitech PM5 polisher (33 rpm, 12" IC1000 pad, 2 psig) on 3" wafers (10,000 Å sputtered W), with 5% alumina slurry (50 parts of 10% alumina+90% water slurry), chemistry addition rate of 100 mL/min, and slurry addition rate of 20 mL/min:

| APS (parts per 100) | Caroat (parts per 100) | pH | Removal Rate (Å/min) |
|---|---|---|---|
| 10 | 1.0 | 5.5 | 90 |
| 10 | 1.0 | 7.5 | 139 |
| 10 | 1.0 | 8.7 | 349 |

Conclusion: Synergism between APS and Caroat enhances W removal rates, with removal rates increasing with increasing pH over the range 5.5 to 8.7.

Oxone, peroxymonsulfate has a standard electrode potential similar to peroxymonosulfate, with a wider range of pH stability (between 2-6 and at 12). This material has ~4.5% "active" oxygen.

Example 4

APS combined with malonamide ($H_2NCOCH_2CONH_2$) shows W removal rates comparable with those of APS+ malonic acid using the Logitech PM5 polisher (33 rpm, 12" IC1000 pad, 2 psig) on 3" wafers (10,000 Å sputtered W), with 5% alumina slurry (50 parts of 10% alumina +90% water slurry), chemistry addition rate of 90 mL/min, and slurry additional rate of 20 mL/min:

| APS (parts per 100) | Malonamide (parts per 100) | pH | Removal Rate (Å/min) |
|---|---|---|---|
| 5 | 0 | 9.0 | 176 |
| 10 | 1.0 | 9.0 | 429 |
| 10 | 2.5 | 8.9 | 385 |
| 10 | 2.0 | 7.9 | 250 |
| 10 | 0 | 7.9 | 198 |

Conclusion: Malonamide enhances the W removal rate when combined with APS in an aqueous system over the W removal rate of APS alone. Removal rates increase with pH.

Though the use of hydrogen peroxide is well known in the metal CMP field it does suffer from poor long term stability when mixed with slurry mixtures. The CMP users have made adjustments to this problem by segregating the peroxide solution from the slurry until just prior to usage on the polisher. This means that the CMP user must have dual dispensing systems which increases the cost of ownership which directly affects the CMP cost per wafer.

In accordance with another aspect of the invention, perborates such as sodium perborate tetrahydrate are good compounds which are indirect sources for hydrogen peroxide. The teraborate has a 10.5% active oxygen content. This compound has a different stability than hydrogen peroxide and therefore could be an important compound for CMP metal etching applications. The dry form of the perborate salt is used in many bleaching applications, including detergent formulations, tooth powders and denture cleaners.

Because of the sodium perborate's low solubility it could also be used as a slurry or coslurry component. This could be very beneficial to the CMP process since the chemistry is not only acting as an abrasive but also as an oxidant. Its low solubility but direct contact with the metal/metal oxide could give better etch control.

Other compounds such as sodium carbonate peroxhydrate ($2Na_2CO_3*3H_2O_2$) contain ~14 wt % active oxygen. This compound also has a better stability than hydrogen peroxide and therefore could be an important material for metal CMP.

Test: Experiments with blanket Al metal (5000) wafer showed that a 5 wt % hydroxylamine solution will remove 2 Å/min of the metal, but a 5 wt % sodium percarbonate removed 6.4 Å/min. The polishing conditions were with a Logitech P5M polisher with a Politex felt cloth at 33 rpm and 2 psi pressure on the 3" wafer. No slurry was used during the test.

Example 5

Experiments with blanket W metal (10,000 Å) wafer showed that a 10 wt % hydroxylamine solution will remove 3.3 Å/min of the metal, but a 5 wt % sodium percarbonate removed 168 Å/min. Experiments also showed that a 2 wt % ferric nitrate solution will remove only 34 Å/min of metal. The polishing conditions were with Logitech P5M polisher with a Politex felt cloth at 33 rpm and 2 psig pressure on the 3" wafer. No slurry was used during the test.

In accordance with a further aspect of the invention, another compound that will be of interest will be the urea hydrogen peroxide complex which will permit a more controlled introduction of the oxidizing chemistry into the slurry system.

Example 6

Experiments with blanket W metal (10,000 Å) wafer showed that a 15 wt % hydrogen perioxide solution with 5% alumina slurry removed 109 Å/min of the metal, yet only a 2 wt % urea hydrogen peroxide with only a 2 wt % alumina slurry removed 83 Å/min. It is interesting that a solution seven times more dilute and less slurry removes almost as much metal as the hydrogen peroxide solution. The polishing conditions were with a Logitech P5M polisher with a Politex felt cloth at 33 rpm and 2 psig pressure on the 3" wafer.

This combination of chemicals will generate environmentally "friendly" waste products (urea and oxygen).

In accordance with still another aspect of the invention, another commercially available oxidizing agent that could effective for planarization tungsten or copper metal is peracetic acid. The decomposition products include only oxygen and acetic acid (vinegar).

Test: Experiments with blanket W metal (10,000 Å) wafer showed that a 15 wt % hydrogen peroxide solution with a 5% alumina slurry removed 109 Å/min of the metal, yet only a 3.5 wt % peracetic acid with only a 2 wt % alumina slurry removed 166 Å/min. It is interesting that a solution four time mores dilute and less slurry removes 50% more metal as the hydrogen peroxide solution. The polishing conditions were with a Logitech P5M polisher with a Politex felt cloth at 33 rpm and 2 psig pressure on the 3" wafer.

In accordance with a further aspect of the invention, another unique idea is to blend two different chemistries to achieve synergistic interactions. Two possible chemicals that could be blended are hydrogen peroxide and hydroxylamine.

Example 7

Experiments with blanket W metal (10,000 Å) wafer showed that a 15 wt % hydrogen peroxide solution with a 5% alumina slurry removed 109 Å/min of the metal, yet a 10 wt % $H_2O_2$ mixed with a 10% hydroxylamine with only a 5 wt % alumina slurry removed 731 Å/min. The pH was adjusted to 8.7. The polishing conditions were with a Logitech P5M polisher with a Politex felt cloth at 33 rpm and 2 psig pressure on the 3" wafer.

Example 8

Experiments with blanket W metal (10,000 Å) wafer showed that a 10 wt % hydroxylamine solution will remove 3.3 Å/min of the metal, but a 5 wt % H2O2 and 5 wt % hydroxylamine (pH 7.5) removed 380 Å/min. Experiments also showed that a 2 wt % ferric nitrate solution will remove only 34 Å/min. of metal. The polishing conditions were with a Logitech P5M polisher with a Politex felt cloth at 33 rpm and 2 psig pressure on the 3" wafer. No slurry was used during the test.

Another aspect of the invention is to blend two different chemistries to achieve synergistic interactions. Two possible chemical that could be blended are ammonium persulfate and potassium periodate. Potassium periodate has a higher oxidation level compared to the potassium iodate.

Example 9

Experiments with blanket W metal (10,000 Å) wafer showed that a 10 wt % ammonium persulfate solution with a 5% alumina slurry removed 162 Å/min of the metal (pH 8), yet a 10 wt % ammonium persulfate mixed with a 2% $KIO_4$ with only a 5 wt % alumina slurry removed 637 Å/min. The pH was adjusted to 6.9.

When a 2 wt % potassium iodate ($KIO_3$) was substituted into the ammonium persulfate solution, the polishing rate decreased to 246 Å/min. The polishing conditions were with a Logitech P5M polisher with a Politex felt cloth at 33 rpm and 2 psi pressure on the 3" wafer.

In another aspect of the invention, a similar chemistry to that of the previous aspect uses a synergism between ammonium persulfate (APS) and periodic acid (rather than potassium periodate) for polishing tungsten.

Example 10

Removal rates of W generally increase with pH for the periodic acid ($H_5IO_6$) in water without APS on 3" wafers coated with sputtered W (10,000 Å) using 1% or 2.5% alumina (10 or 25 parts of 10% alumina+90% water slurry), 0-3 parts $NH_4OH$ to adjust pH, chemistry and slurry combined together at a chemistry/slurry addition rate of 50-100 mL/min, and the Logitech PM5 polisher (33 rpm, 12" IC1000 pad, 2 psig):

| Alumina (parts per 100) | Periodic Acid (parts per 100) | pH | Removal Rate (Å/min) |
| --- | --- | --- | --- |
| 1.0 | 2.0 | 1.4 | 130 |
| 1.0 | 2.0 | 1.9 | 274 |
| 1.0 | 2.0 | 2.1 | 326 |
| 2.5 | 2.0 | 2.5 | 252 |
| 2.5 | 2.0 | 6.8 | 4.26 |

Conclusion: tungsten removal rates increase at higher pH values over a pH range of 1 to 7 with a constant concentration of periodic acid.

Example 11

Periodic acid in water added to APS increases the removal rate of W over APS alone at pH 1; increasing the amount of periodic acid used with 10 parts APS also increases the W removal rate using the Logitech PM5 polisher (33 rpm, 12" IC1000 pad, 2 psig), 3" wafers (10,000 Å sputtered W), 0-3 parts NH4OH to adjust pH, 1% alumina (10 parts of 10% alumina+90% water slurry), and chemistry/slurry addition rate of 100 mL/min:

| APS (parts per 100) | Periodic Acid (parts per 100) | pH | Removal Rate (Å/min) |
| --- | --- | --- | --- |
| 0 | 2.0 | 2.4 | 130 |
| 10 | 2.0 | 1.1 | 386 |
| 10 | 0.5 | 3.5 | 118 |
| 10 | 2.0 | 5.2 | 388 |
| 10 | 0 | 6 | 112 |

Conclusion: There is a synergistic effect that enhances W removal rate when APS and periodic acid are used together. Increased removal rates are observed over a pH range of 1 to 7.

Example 12

Constant removal rates were observed for several days in a periodic acid/$NH_4OH$/water system without APS using 0-3 parts $NH_4OH$ to adjust pH, 2.5% alumina (25 parts of 10% alumina+90% water slurry) added to the chemistry immediately prior to polishing 3" wafers (10,000 Å sputtered W), chemistry/slurry addition rate of 100 niL/min, and the Logitech PM5 polisher (33 ppm, 12" IC1000 pd, 2 psig):

| Time (days) | Period Acid (parts per 100) | Removal Rate (Å/min) |
| --- | --- | --- |
| 0 | 2.0 | 252 |
| 3 | 2.0 | 255 |

Conclusion: Periodic acid has a very good polishing rate when used alone, and, unlike hydrogen peroxide, has a good chemical stability over several days.

Example 13

A comparison of removal rates for the aqueous periodic acid system is shown below between the Logitech polisher (2 psig) with 3" wafers (10,000 Å sputtered W) and the Strasbaugh 6EC polisher (5-7 psig) with 200 mm wafers (10,000 Å sputtered W). Operating conditions were pH 6-7, 2.5% alumina (25 parts of 10% alumina+90% water slurry), no APS, chemistry/slurry addition rate of 200 mL/min for the Strasbaugh 6EC (40-50 rpm, 22" perforated IC 1000 over SUBA IV pads) and 100 mL/min for the Logitech PM5 (33 rpm, 12" IC 1000 pad). The comparison suggests that the removal rates determined used the larger Strasbaugh polisher are 6 to 8.6 times larger than those obtained using the smaller Logitech polisher.

| Period Acid (parts per 100) | pH | Down-force (psig) | Table Speed (rpm) | Polisher | Removal Rate (Å/min) |
|---|---|---|---|---|---|
| 2.0 | 6.8 | 2 | 33 | Logitech PM5 | 426 |
| 2.0 | 6 | 5 | 40 | Strasbaugh 6EC | 2535 |
| 2.0 | 6 | 5 | 40 | Strasbaugh 6EC | 2727 |
| 2.0 | 6 | 5 | 50 | Strasbaugh 6EC | 3174 |
| 2.0 | 6 | 7 | 50 | Strasbaugh 6EC | 3666 |

Conclusion: These results for W polishing show that when comparing removal rates determined using the Logitech planarizer to larger planarizers such as the Strasbaugh 6EC, the removal rates must be scaled up by a factor of 6 to 8.6.

Expanding on the last two aspects of the invention, we did a comparison of polishing rates for the periodate salts potassium periodate ($KIO_4$) and the lithium periodate ($LiH_4IO_6$) as well as potassium iodate ($KIO_3$) that was used in Wang et al., published PCT Application WO 97 13,889, dated Apr. 17, 1997. The $KIO_4$ system proved to have higher removal rates for W than did the $KIO_3$ system; W removal rates are enhanced when synergistically combining $KIO_4$ and APS; and both K and Li periodate may be used to oxidize W in near-neutral pH regimes, thus getting away from corrosion problems associated with very low pH CMP systems. In mixtures of K and Li periodates with APS, systems with higher proportions of Li:K provide higher W removal rates.

Example 14

Addition of APS to $KIO_3$ in water increases the W removal rate, and increasing amounts of $KIO_3$ added to APS also increase W removal rates over a pH range of 5.8 to 7.8 (pH adjusted with 0-3 parts NaOH) using the Logitech PM5 polisher (33 rpm, 12" IC1000 pad, 2 psig), 3" wafers (10,000 Å sputtered W), 5% alumina (50 parts of 10% alumina+90% water slurry), and separate addition of chemistry and slurry with a chemistry addition rate of 90 mL/min, and slurry addition rate of 20 mL/min:

| APS (parts per 100) | $KIO_3$ (parts per 100) | pH | Removal Rate (Å/min) |
|---|---|---|---|
| 0 | 2.0 | 7.0 | 193 |
| 10 | 2.0 | 7.2 | 246 |
| 10 | 2.0 | 5.8 | 208 |
| 10 | 5.0 | 7.2 | 339 |
| 10 | 5.0 | 7.8 | 350 |

Conclusion: Adding APS to $KIO_3$ increases the W removal rate, increasing pH of the combined APS/$KIO_3$/water system increases the W removal rate, and increasing the concentration of $KIO_3$ in the combined system increases the W removal rate.

Example 15

The aqueous potassium periodate ($KIO_4$) system, with the same polishing parameters as above, also shows a synergistic effect when combined with APS and shows even a greater removal rate for W than the potassium iodate system. NaOH (0-3 parts) was used to adjust pH. Operating conditions included using the Logitech PM5 polisher (33 rpm, 12" IC1000 pad, 2 psig), 3" wafers (10,000 Å sputtered W), 5% alumina (50 parts of 10% alumina+90% water slurry), chemistry addition rate of 90 mL/min, and slurry addition rate of 20 mL/min:

| APS (parts per 100) | $KIO_4$ (parts per 100) | pH | Removal Rate (Å/min) |
|---|---|---|---|
| 0 | 0.2 | 7.9 | 142 |
| 10 | 0.2 | 7.7 | 405 |
| 10 | 2.0 (supersaturated solution) | 6.9 | 637 |

Conclusion: Synergism between APS and $KIO_4$ enhances W removal rates at near-neutral pH.

Example 16

Mixtures of Li and K periodate show improved removal rates for higher proportions of Li:K. There is also an effect of pH noted in the table below: increased removal rate with increasing pH. Polishing parameters are for the Logitech PM5 polisher (33 rpm, 12" IC1000 pad, 2 psig), 3" wafers (10,000 Å sputtered W), 1% alumina (10 parts of 10% alumina+90% water slurry), and chemistry/slurry addition rate of 100 mL/min:

| APS (parts per 100) | $LiH_4IO_6$ (parts per 100) | $KIO_4$ (parts per 100) | pH | Removal Rate (Å/min) |
|---|---|---|---|---|
| 10 | 0.4 | 0.0 | 7.2 | 382 |
| 10 | 0.3 | 0.1 | 7.2 | 215 |
| 10 | 0.2 | 0.2 | 6.5 | 175 |
| 10 | 0.1 | 0.3 | 6.1 | 170 |

Conslusion: Addition of Li and/or K periodate to an aqueous APS system enhances W removal at near-neutral pH. In mixed Li/K periodate+APS systems, higher proportions of Li:K provide higher W removal rates at near-neutral pH.

Example 17

Tungsten removal rates using the 10 parts APS+0.4 parts Li periodate are stable for a period of several days when combined with alumina slurry. The pH was not adjusted, but stayed near-neutral, between pH 6.4 and 7.6, during the course of the test. Polishing was done used the Logitech PM5 polisher (33 rpm, 12" IC1000 pad, 2 psig), 3" wafers (10,000 Å sputtered W), 5% alumina (50 parts of 10% alumina+90% water slurry), and chemistry/slurry addition rate of 100 mL/min:

| Time (days) | Removal Rate (Å/min) |
|---|---|
| 1 | 208 |
| 7 | 244 |
| 15 | 218 |

Conclusion: Even when combined with alumina slurry, the APS/LiH$_4$IO$_6$/water system has high and stable removal rates for more than 2 weeks, providing a better shelf life than the acidic ferric nitrate/water alumina system which must be combined at point-of-use.

Example 18

A quantity of 500 ml of two comparative chemical solutions was each placed in a 600 ml beaker equipped with a magnetic stirring rod. The first ammonium persulfate solution consisted of 114 parts of ammonium persulfate in deionized water to give total of 1000 parts of solution having a pH of 3.1. The second ferric (III) nitrate solution consisted of 40 parts of ferric (III) nitrate nanohydrate dissolved in deionized water to give a total of 1000 parts of solution having a pH of 1.5. These solutions were tested with silicon wafers at room temperature as follows:

Three inch wafers with a 300 Angstroms (Å) Ti metal adhesion layer and 3000 Å sputtered Cu were used. At selected time intervals, the wafer sample was removed, rinsed with DI water and then dried with nitrogen gas. A conventional four point probe was used to determine the metal film thickness. The etch rates were:

| Ammonium persulfate | 3000 Å/min |
|---|---|
| Ferric (III) nitrate | 1287 Å/min |

One would have expected the chemistry with the lowest pH (more acidic), i.e., the ferric (III) nitrate solution, to etch the Cu the fastest.

Example 19

In this series of tests, the effectiveness of hydroxylamine nitrate at various pH levels was tested for etch wafers with 3000 Å sputtered Cu and a 300 Å Ti adhesion layer. The apparatus was as used in Example 1. The solution was composed of 24 parts by weight of 82 weight percent hydroxylamine nitrate in 176 parts by weight of DI water. The pH was adjusted with small quantities of hydroxylamine, as the free base. The hydroxylamine free base was composed of 20 parts by weight of its commercially available approximately 50 percent by weight aqueous solution and 80 parts by weight deionized water. Also used was an ammonium hydroxide solution composed of 80 parts by weight of a 25 percent by weight aqueous ammonium hydroxide solution and 120 parts by weight of deionized water.

After a certain interval, the wafer was rinsed with deionized water and dried with nitrogen. The wafer was then weighed. A separate blank Ti wafer was etched in a 10 percent by weight H$_2$O$_2$ solution to determine the amount of Cu on each 3 inch wafer. The results obtained are shown in the table below.

| Chemistry | pH | Etch rate (Å/min) |
|---|---|---|
| Hydroxylamine nitrate | 3 | 120 |
| Hydroxylamine nitrate | 4 | 150 |
| Hydroxylamine nitrate | 5 | 600 |
| Hydroxylamine (free base) | 11.7 | 75 |
| Ammonium hydroxide | 12.7 | 100 |

It is well known that Cu metal will be etched with inorganic and organic amines at pHs above 9. It is also known that Cu metal will be etched at very low pHs (below 3). The above results are quite surprising, since a significant etch rate was seen at ph 5.

In a further aspect of the invention, other chemistries that have given good CMP process results are based on hydroxylamine nitrate (HAN) and other hydroxylamine salts. Besides several examples with HAN, one example examines the use of citric acid in combination with HAN. Other combinations could include mono-, di- and tri-organic acids. Examples of such acids include, but are not limited to acetic acid, malonic acid and citric acid, respectively.

Example 20

Amines (and ammonia compounds) are more effective in neutral or basic solutions for polishing (etching) copper. Some ammonium compounds have only moderate success at polishing copper at low pHs. Hydrogen peroxide chemistries are usually used at low pHs. The following example shows that hydroxylamine nitrate (HAN, a mild oxidizing agent) will effectively polish copper. Hydroxylamine and its salts are not amines but do contain the NH2-group found in inorganic and organic amines. Hydroxylamine's NH2-group is attached to a hydroxyl (HO-group) which is not found in "amines" and does influence its oxidation-reduction potential.

These results were obtained by immersing a copper wafer (10,000 Å) in stirred 10% hydroxylamine nitrate solutions (12.2 parts of 82% HAN in 87.8 parts water) for various time periods. At certain time periods the wafers were removed, rinsed with DI water, dried with nitrogen and then weighed to the nearest 0.1 mg. Another wafer from the same group was etched with an ammonium peroxydisulfate solution (10 parts peroxydisulfate and 90 parts water) until there was no further weight loss. It was possible to use weight ratios to determine the metal loss in Å/min. The hydroxylamine nitrate results were compared to a 10% ammonium hydroxide solution (10 parts 27% ammonium hydroxide in 90 parts water) under similar conditions.

| | pH | Removal Rate (/min) |
|---|---|---|
| | 3.1 | 120 |
| | 4.0 | 150 |
| | 5.0 | 600 |
| NH$_4$OH | 12.7 | 100 |

This example shows that hydroxylamine compound will remove copper metal and that there is a definite optimum pH. The ammonium hydroxide had the poorest etch rate even though this is an optimum pH region for etching copper with amines.

Example 21

In this example the hydroxylamine nitrate chemistry is used in a slurriless polishing system. A Logitech PM5 polishing system (used for CMP modeling experiments) was used with a Politex felt pad at 33 rpm with 2 psig pressure on the 3" copper wafer. The 5% chemistry (6.1 parts HAN with 95.9 parts water) was added to the polishing table at 50 mL/min. The removal rate was determined by a Four Dimensions four point probe used for determining metal film thickness on wafers.

| pH | Removal Rate (Å/min) |
| --- | --- |
| 4.2 | 18 |
| 6.0 | 218 |

This example shows that there is a pH effect with the HAN solutions. The metal film had a very bright finish.

Example 22

In this example a 10% hydroxylamine nitrate solution (12.2 parts of HAN in 87.8 parts water) mixed with a 2.5% silicon oxide slurry was used with a Politex pad on the Logitech PM5 polisher was 33 rpm with 2 psig pressure on the 3" copper wafer. The chemistry was added to the polishing pad at 90 mL/min. The removal rate was determined by a Four Dimensions four point probe for determining metal film thickness on wafers.

| pH | Removal Rate (Å/min) |
| --- | --- |
| 2.6 | 1270 |
| 4.0 | 1014 |

This example shows that the use of a silicon oxide slurry will shift the effective polishing rate to very low pHs with very good copper removal rates. This example also shows that the HAN chemistry works well with slurries with the Logitech modeling equipment. The metal film had a very bright finish.

Example 23

In this example a commercial alumina slurry is used with various chemistries. The slurry concentration was 2.5% used with a Politex pad on the Logitech PM5 polisher at 33 rpm with 2 psig pressure on the 3" copper water. The hydrogen peroxide solution was composed of 15 parts of a 30% $H_2O_2$ solution mixed with 85 parts of water.

| | pH | Removal Rate (Å/min) |
| --- | --- | --- |
| 5% HAN | 5 | 950+ |
| 5% HAN | 5 | 950+ |
| 5% HAN | 6 | 575+ |
| 15% $H_2O_2$ | 4 | 65 |
| $H_2O$ | 4.8 | 44 |

This example shows that the polishing rate for HAN is reproducible and is polishing better than the traditional hydrogen peroxide chemistry for copper CMP. The water experiment shows that the copper polishing rate is not solely a pH effect. The metal films polished with HAN had very bright finishes, but the hydrogen peroxide polished wafer was "cloudy" and the water polished wafer was dull.

Example 24

Another important feature is a good shelf life after the slurry and chemistry are mixed together. Currently the hydrogen peroxide/slurry systems are so unstable that the industry currently mixes the slurry and the chemistry only at the point of use. Premixed hydrogen peroxide/slurry solutions only have several hours of useful life.

In this example a 0.5 wt % hydroxylamine nitrate solution (0.6 parts of HLAN in 99.4 parts water) mixed with a 2.5% alumina slurry. A master batch was made and stored in a plastic container. Samples of the chemistry/slurry were then removed after certain number of days and used in the polishing experiment. The pH of the slurry varied only between 4 and 4.1 during the 22 day trial. The slurry mixture was used with a Politex pad on the Logitech PM5 polisher at 33 rpm with 2 psig pressure on the 3" copper wafer. The chemistry was added to the polishing pad at 50 mL/min. The removal rate was determined by a Four Dimensions four point probe for determining metal film thickness on wafers.

| Day | Removal Rate (Å/min) |
| --- | --- |
| 0 | 637 |
| 4 | 1064 |
| 22 | 558 |

Except for the fourth day result which increased by ~40%, the 22nd day result clearly shows that the chemistry is still giving good polishing rates. The metal films had very bright finishes.

Example 25

Another feature is the selectivity of the polishing rate between different materials on the wafer. It is important that all materials (metals and the surrounding IDL layers) are not polished at the same rate, otherwise it would be difficult to stop at a specific layer.

The following example shows the selectivity between the copper metal and a BPSG film. In this example a 0.5 wt % hydroxylamine nitrate solution (0.6 parts of HAN in 99.4 parts water) is mixed with a 2.5% alumina slurry. The pH of the slurry varied between 4 and 4.4. The slurry mixture was used with a Politex pad on the Logitech PM5 polisher at 33 rpm with 2 psig pressure on the 3" copper wafer. The chemistry was added to the four point probe for determining metal film thickness on wafers, and the BPSG film thickness was determined by ellipsometer.

The copper film removal rate was 637 Å/min while the BPSG film was only polished at a 37 Å/min rate. The selectivity of Cu to BPSG was 17.2. This means that the polishing process will "stop" when the BPSG layer is reached, since it has a much slower polishing rate.

In further aspect of the invention, another way to polish copper is to use a combination of chelating agents (polyfunctional organic acids) with the conjugate hydroxylamine salts.

Example 26

In this example a solution of citric acid (8.8 parts citric acid adjusted with hydroxylamine to a pH 4.2 to 4.4, the remainder is water) is mixed with various concentration of hydroxylamine (HDA) to obtain solutions with pHs close to neutral. These chemistries were used in a slurry polishing system. A Logitech PM 5 polishing system was used with a Politex felt pad at 33 rpm with 2 psig pressure on the 3" copper wafer. The chemistries were added to the polishing table between 20 to 90 mL/min. The removal rate was determined by a Four Dimensions four point probe for determining metal film thickness on wafers.

| Parts Citric Acid Sol. | Parts HDA | pH | Removal Rate (Å/min) |
|---|---|---|---|
| 100 | 0 | 4.2 | 58 |
| 95 | 5 | 6.6 | 64 |
| 90 | 10 | 6.8 | 954 |
| 80 | 20 | 7.0 | 1100 |

This example shows that even though the pH is only varied over a 0.4 pH range (for the HDA salt solutions) there was a significant increase in the copper etch rate, related to the increase in the hydroxylamine salt of the citric acid.

The invention now being fully described, it will be apparent to one of ordinary skill in the art that many changes and modifications can be made thereto without departing from the spirit or scope of the invention.

What is claimed is:

1. A metal layer polishing slurry comprising:
an abrasive and a compound selected from the group consisting of hydroxylamine, hydroxylamine nitrate, hydroxylamine chloride, and hydroxylamine sulfate wherein said slurry has a pH which is neutral or basic.

2. A metal layer polishing slurry comprising:
an abrasive and a compound selected from the group consisting of hydroxylamine, hydroxylamine nitrate, hydroxylamine chloride, and hydroxylamine sulfate, wherein said slurry contains alumina as an abrasive.

3. The slurry of claim 2, wherein the pH of said slurry has a pH between 2.6 and 6.8.

4. The slurry of claim 1, wherein the pH of said slurry is basic.

5. The slurry of claim 2, further comprising a chelating agent and surfactant.

6. The slurry of claim 1, wherein said compound is hydroxylamine.

7. The slurry of claim 2, wherein the pH of said slurry is acidic.

8. The slurry of claim 6, wherein the pH of said slurry is basic.

9. A metal layer polishing slurry comprising:
an abrasive and a compound selected from the group consisting of hydroxylamine, hydroxylamine nitrate, hydroxylamine chloride, and hydroxylamine sulfate, said slurry further comprising an organic acid.

10. The slurry of claim 9 wherein the organic acid is selected from the group consisting of oxalic acid, peracetic acid, lactic acid, malonic acid, citric acid, lactic acid, periodic acid, gluconic acid, tartaric acid, and combinations thereof.

11. A composition comprising:
a chemical mechanical polishing slurry comprising an abrasive and hydroxylamine nitrate.

12. The slurry of claim 11, wherein the pH of said slurry has a pH between 2.6 and 6.8.

13. The slurry of claim 11, wherein the pH of said slurry is basic.

14. The slurry of claim 11, wherein said slurry contains alumina as an abrasive.

15. The slurry of claim 14, further comprising a chelating agent and surfactant.

16. The slurry of claim 11, wherein the pH of said slurry is acidic.

17. The slurry of claim 11, further comprising an organic acid.

18. The slurry of claim 17, wherein the organic acid is selected from the group consisting of oxalic acid, peracetic acid, lactic acid, gluconic acid, malonic acid, citric acid, lactic acid, periodic acid, gluconic acid, tartaric acid, and combinations thereof.

19. The slurry of claim 11, wherein the concentration of hydroxylamine nitrate is about 0.5% by weight.

20. The slurry of claim 1, wherein the pH of said slurry is neutral.

* * * * *

UNITED STATES PATENT AND TRADEMARK OFFICE
CERTIFICATE OF CORRECTION

PATENT NO. : 7,276,180 B2  Page 1 of 1
APPLICATION NO. : 10/401405
DATED : October 2, 2007
INVENTOR(S) : Small et al.

It is certified that error appears in the above-identified patent and that said Letters Patent is hereby corrected as shown below:

Please amend the claims as follows:

In column 24, line 20, correct claim 11 to read:

--11. A composition comprising:
a chemical mechanical polishing slurry comprising an abrasive and hydroxylamine nitrate.--

Signed and Sealed this

Twenty Second Day of April, 2008

JON W. DUDAS
*Director of the United States Patent and Trademark Office*